United States Patent [19]
Kaida

[11] Patent Number: 5,192,925
[45] Date of Patent: Mar. 9, 1993

[54] PIEZOELECTRIC RESONATOR AND METHOD OF FABRICATING THE SAME

[75] Inventor: Hiroaki Kaida, Nagaokakyo, Japan

[73] Assignee: Murata Manufacturing Co., Ltd., Japan

[21] Appl. No.: 694,815

[22] Filed: May 2, 1991

[51] Int. Cl.⁵ ............................................. H03H 9/00
[52] U.S. Cl. ................................. 333/187; 333/188; 333/192; 310/367
[58] Field of Search ............... 333/187, 186, 188, 189, 333/190, 191, 192; 310/367, 370, 365, 366, 368

[56] References Cited
U.S. PATENT DOCUMENTS
3,836,877 9/1974 Guntersdorfer et al. ...... 333/187 X FOREIGN PATENT DOCUMENTS
2-99310 12/1990 Japan .

Primary Examiner—Paul M. Dzierzynski
Assistant Examiner—Ali Neyzari
Attorney, Agent, or Firm—Ostrolenk, Faber, Gerb & Soffen

[57] ABSTRACT

A piezoelectric resonator which comprises a piezoelectric resonance element in which electrodes are formed on a pair of side surfaces, which are opposed to each other, of a piezoelectric substrate. The electrodes are opposed to each other while being separated by the piezoelectric substrate in the center of the piezoelectric substrate to form a vibrating portion of an energy-trapped type utilizing a thickness shear vibration mode in the center of the piezoelectric substrate. Spacers are respectively fixed to the side surfaces of the piezoelectric substrate with gaps being provided between the spacers and the above-mentioned vibrating portion, and a pair of cover sheets are respectively affixed to both major surfaces of a structure comprising the spacers and the piezoelectric resonance element so as to form gaps on top of and beneath the vibrating portion in the piezoelectric resonance element.

22 Claims, 9 Drawing Sheets

PIEZOELECTRIC RESONATOR AND METHOD OF FABRICATING THE SAME

BACKGROUND OF THE INVENTION

1. Field of the Invention

The present invention relates generally to a piezoelectric resonator utilizing a thickness shear vibration mode and a method of fabricating the same, and more particularly, to a piezoelectric resonator having a structure in which the thickness of a product having the resonator is independent of the resonance frequency, and a method of fabricating the same.

2. Description of the Prior Art

Referring to FIGS. 11 and 12, one example of a conventional piezoelectric resonator will be described. A piezoelectric resonator 1 shown in FIG. 11 is constructed using a piezoelectric resonance element 2 of an energy-trapped type utilizing a thickness shear vibration mode, spacers 3 and 4, and cover plates or sheets 5 and 6, as shown in FIG. 12.

The piezoelectric resonance element 2 has a structure in which electrodes 2b and 2c are respectively formed on both major surfaces of a piezoelectric substrate 2a. The electrodes 2b and 2c are opposed to each other while being separated by the piezoelectric substrate 2a in the center of the piezoelectric substrate 2a, thereby to form a vibrating portion of an energy-trapped type utilizing a thickness shear vibrating mode in a region where the electrodes 2b and 2c are opposed to each other.

The spacers 3 and 4 are respectively arranged in side parts of the piezoelectric resonance element 2. The spacers 3 and 4 are constituted by rectangular insulating plates and have cutout portions 3a and 4a formed by cutting away parts of side surfaces of the insulating plates, respectively. The cutout portions 3a and 4a are provided so as to form gaps for not preventing the vibration of the above described vibrating portion.

In the fabrication of the piezoelectric resonator, the spacers 3 and 4 are first respectively fastened to both side surfaces of the piezoelectric resonance element 2 and then, the cover sheets 5 and 6 are respectively affixed to the piezoelectric resonance element 2 and the spacers 3 and 4 so as to cover both major surfaces of the piezoelectric resonance element 2 and the spacers 3 and 4. The cover sheets 5 and 6 are respectively constituted by rectangular insulating members having notches 5a and 5b and 6a and 6b. The notches 5b and 6a are respectively provided so as to expose the electrodes 2b and 2c in the piezoelectric resonance element 2 to the exterior (see FIG. 11) to make it easy to make electrical connection to the exterior.

Reference numerals 7 and 8 denote adhesive layers. As shown in FIG. 12, the adhesive layer 8 is provided in a peripheral region excluding a central region 6c on the upper surface of the cover sheet 6. This is for forming a gap so that the thickness of the adhesive layer 8 does not prevent the vibration of the vibrating portion in the piezoelectric resonance element 2 after lamination. Similarly, the adhesive layer 7 is provided in a peripheral region excluding a central region on the lower surface of the cover sheet 5.

In the piezoelectric resonator 1 shown in FIG. 11, the thickness t of the piezoelectric resonance element 2 utilizing a thickness shear vibration mode is determined by a desired resonance frequency. For example, when the resonance frequency is 3.58 MHz, the thickness t must be generally about 0.35 mm. Consequently, when it is desired to limit the entire thickness T of the piezoelectric resonator 1 to be, for example, 0.5 mm or less, the total of the thickness of the adhesive layers 7 and 8 and the cover sheets 5 and 6 must be 0.15 mm or less. As a result, the thicknesses of the cover sheets 5 and 6 must be substantially decreased, thereby to make it impossible to obtain a piezoelectric resonator having considerable mechanical strength.

SUMMARY OF THE INVENTION

Accordingly, an object of the present invention is to provide a piezoelectric resonator which has considerable mechanical strength irrespective of a desired resonance frequency and thus, is suitable for being made thinner, and a method of fabricating the same.

The present invention is directed to a piezoelectric resonator comprising a piezoelectric resonance element utilizing a thickness shear vibration mode which has a piezoelectric substrate and a pair of electrodes formed on a pair of side surfaces, which are opposed to each other, of the piezoelectric substrate and opposed to each other while being separated by the piezoelectric substrate in the center of the piezoelectric substrate to form a vibrating portion in a region where the above electrodes are opposed to each other, spacers respectively fastened to the above side surfaces of the piezoelectric substrate in the above piezoelectric resonance element with gaps being provided between the spacers and the above vibrating portion, and cover sheets respectively fastened to both major surfaces of the above piezoelectric resonance element and the above spacers so as to provide gaps for not preventing the vibration of the vibrating portion on and beneath the above vibrating portion.

Furthermore, a method of fabricating a piezoelectric resonator according to the present invention comprises the steps of preparing a piezoelectric resonance element utilizing a thickness shear vibration mode which has a piezoelectric substrate and a pair of electrodes formed on a pair of side surfaces, which are opposed to each other, of the piezoelectric substrate and opposed to each other while being separated by the piezoelectric substrate in the center of the piezoelectric substrate to form a vibrating portion and a pair of spacers composed of plate-shaped members, respectively fixing the above spacers on side surfaces, on which the electrodes are formed, of said piezoelectric resonance element with gaps for not preventing the vibration of the vibrating portion being provided between the spacers and the vibrating portion, and respectively affixing a pair of cover sheets to both major surfaces of a structure comprising the above spacers and the above piezoelectric resonance element so as to leave gaps for not preventing the vibration of the vibrating portion in the above piezoelectric resonance element.

In the present invention, electrodes are provided on a pair of side surfaces, which are opposed to each other, of a piezoelectric resonance element, a vibrating portion utilizing a thickness shear vibration mode is formed in the center of the pair of side surfaces, and spacers are fastened to the above side surfaces so as to have gaps between the spacers and the vibrating portion. In addition, cover sheets are affixed to both major surfaces of a structure comprising the piezoelectric resonance element and the spacers with gaps being provided on and beneath the vibrating portion in the piezoelectric resonance element. Consequently, the resonance frequency of the piezoelectric resonance element is determined by the distance between the electrodes, that is, the distance between the side surfaces and is independent of the thickness of the piezoelectric resonance element. Accordingly, the thickness of the piezoelectric resonance element can be arbitrarily set irrespective of the resonance frequency, thereby to make it possible to obtain piezoelectric resonators having various resonance frequencies without altering the thickness as well as to use as the cover sheets ones having considerable strength in terms of material and construction. Accordingly, even when the entire thickness is decreased, it is possible to construct a piezoelectric resonator having considerable mechanical strength.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
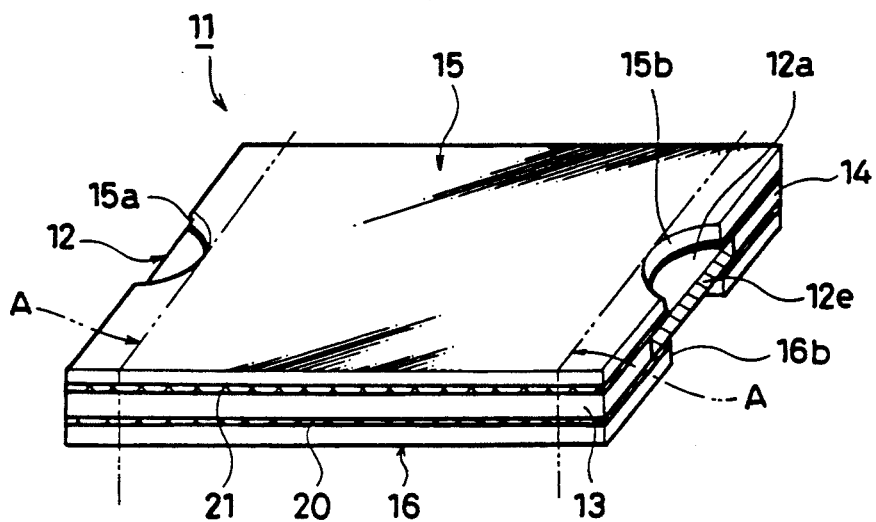
FIG. 1 is a perspective view showing a piezoelectric resonator according to a first embodiment of the present invention.
Figure 2:
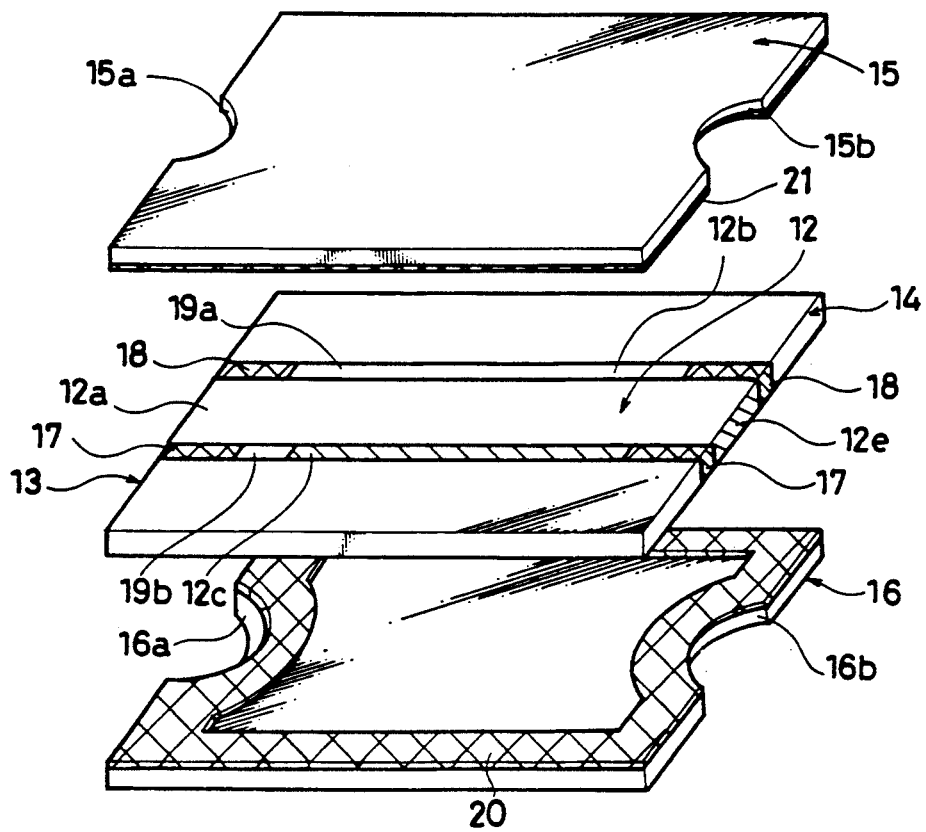
FIG. 2 is an exploded perspective view showing the piezoelectric resonator according to the first embodiment.

FIG. 1 is a perspective view showing a piezoelectric resonator according to a first embodiment of the present invention, and FIG. 2 is an exploded perspective view showing the above piezoelectric resonator.

A piezoelectric resonator 11 shown in FIG. 1 has a structure in which spacers 13 and 14 are respectively fastened to side parts of a piezoelectric resonance element 12 having a long narrow rectangular plate shape, and cover sheets 15 and 16 are respectively affixed to both major surfaces of a structure comprising the piezoelectric resonance element 12 and the spacers 13 and 14, as shown in FIG. 2.

Figure 3:
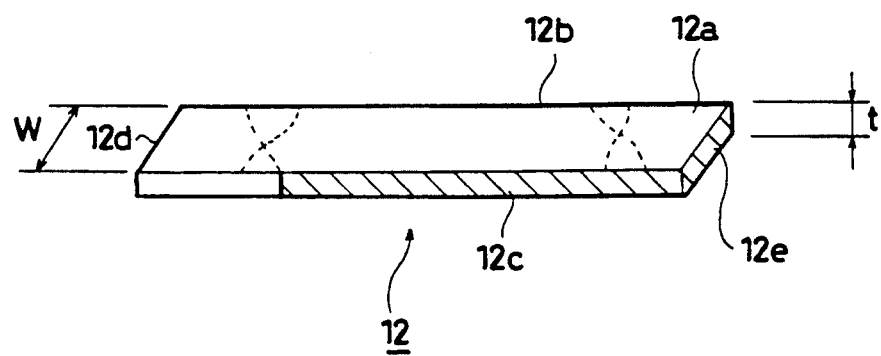
FIG. 3 is a perspective view showing a piezoelectric resonance element used in the first embodiment.

The piezoelectric resonance element 12 has a structure in which electrodes 12b and 12c are formed on a pair of side surfaces, which are opposed to each other, of a piezoelectric substrate 12a having a long narrow rectangular plate shape, as shown in FIG. 3. The electrodes 12b and 12c are formed so as to be opposed to each other while being separated by the piezoelectric substrate 12a in a central region of the piezoelectric substrate 12a, thereby to form a vibrating portion of an energy-trapped type utilizing a thickness shear vibration mode in a region where the electrodes 12b and 12c are opposed to each other.

In the present embodiment, terminal electrodes 12d and 12e electrically connected to the electrodes 12b and 12c are respectively formed on both end surfaces of the piezoelectric substrate 12a. The terminal electrodes 12d and 12e are provided so as to make it easy to electrically connect the piezoelectric resonator 11 shown in FIG. 1 to the exterior. However, it is not always necessary to form the terminal electrodes 12d and 12e.

The piezoelectric resonance element 12 shown in FIG. 3 resonates by applying an AC electric field to the electrodes 12b and 12c. With this configuration the piezoelectric substrate 12a expands and contracts, as represented by a broken line in FIG. 3. In addition, the resonance frequency of the piezoelectric resonance element 12 depends on not the wall thickness t of the piezoelectric substrate 12a but the width W thereof. Consequently, it is possible to obtain a piezoelectric resonance element 12 having a desired resonance frequency without altering the wall thickness t.

Although in FIG. 3, the side surfaces, on which the electrodes 12b and 12c are formed, of the piezoelectric substrate 12a are in such a shape as to have a relatively smaller area than that of the upper and lower surfaces of the piezoelectric substrate 12a, the side surfaces, on which the electrodes 12b and 12c are formed, of the piezoelectric substrate 12a may be conversely in such a shape as to have a larger area than that of the upper and lower surfaces of the piezoelectric substrate 12a. That is, the thickness t may be larger than the width W, in FIG. 3.

Turning to FIG. 2, the spacers 13 and 14, having a rectangular plate shape, and being made of an insulating material having the same wall thickness as that of the piezoelectric resonance element 12, are respectively fastened to the side parts of the piezoelectric resonance element 12 by adhesive layers 17 and 18. The adhesive layers 17 and 18 are shaped so as not to contact the above described vibrating portion in the piezoelectric resonance element 12. As a result, gaps 19a and 19b are respectively formed between the vibrating portion in the piezoelectric resonance element 12 and the spacers 13 and 14. The gaps 19a and 19b are provided so as not to prevent the vibration of the vibrating portion.

The cover sheets 15 and 16 are respectively affixed to both major surfaces of a structure comprising the piezoelectric resonance element 12 and the spacers 13 and 14 fastened to the side parts thereof, as shown in FIG. 2. An adhesive layer 20 is provided on the upper surface of the cover sheet 16 along the outer periphery of the cover sheet 16. Similarly, an adhesive layer is provided on the lower surface of the cover sheet 15. The adhesive layer 20 is provided on the upper surface of the cover sheet 16 along the outer periphery of the cover sheet 16 so as to form a gap for not preventing the vibration of the vibrating portion in the piezoelectric resonance element 12 beneath the piezoelectric resonance element 12 after affixing. Similarly, an adhesive layer 21 is provided on the lower surface of the cover sheet 15 only along the outer periphery of the cover sheet 15, thereby to form a similar gap on the piezoelectric resonance element 12.

The cover sheets 15 and 16 are made of a suitable rigid material such as insulating ceramics. In the present embodiment, notches 15a and 15b and 16a and 16b are respectively formed in both edges of the cover sheets 15 and 16. Consequently, as seen in FIG. 1, both ends of the piezoelectric resonator 12 are exposed over a wide area by the notches 15a, 15b, 16a and 16b. Accordingly, it is possible to electrically connect the terminal electrodes 12d and 12e (see FIG. 3) reliably to the exterior.

The above described notches 15a to 16b are not indispensable constituent elements in the present invention. For example, a piezoelectric resonator in a shape obtained by cutting in the direction of thickness along portions represented by two-dot and dash lines A in FIG. 1 may be constructed. However, in the piezoelectric resonator obtained by cutting along the two-dot and dash lines A, it is preferably that the terminal electrodes 12d and 12e (see FIG. 3) are respectively provided to both end surfaces of the piezoelectric substrate 12a. In that case, the terminal electrodes 12d and 12e formed on the end surfaces of the piezoelectric resonance element 12 may be formed by sputtering along with the electrodes 12b and 12c in the step of obtaining the piezoelectric resonance element 12 shown in FIG. 3, or may be formed by sputtering or the like after a laminated body shown in FIG. 1 is constructed. In addition, the terminal electrodes 12d and 12e may be coated with solder by the dipping process or the like.

Figure 4:
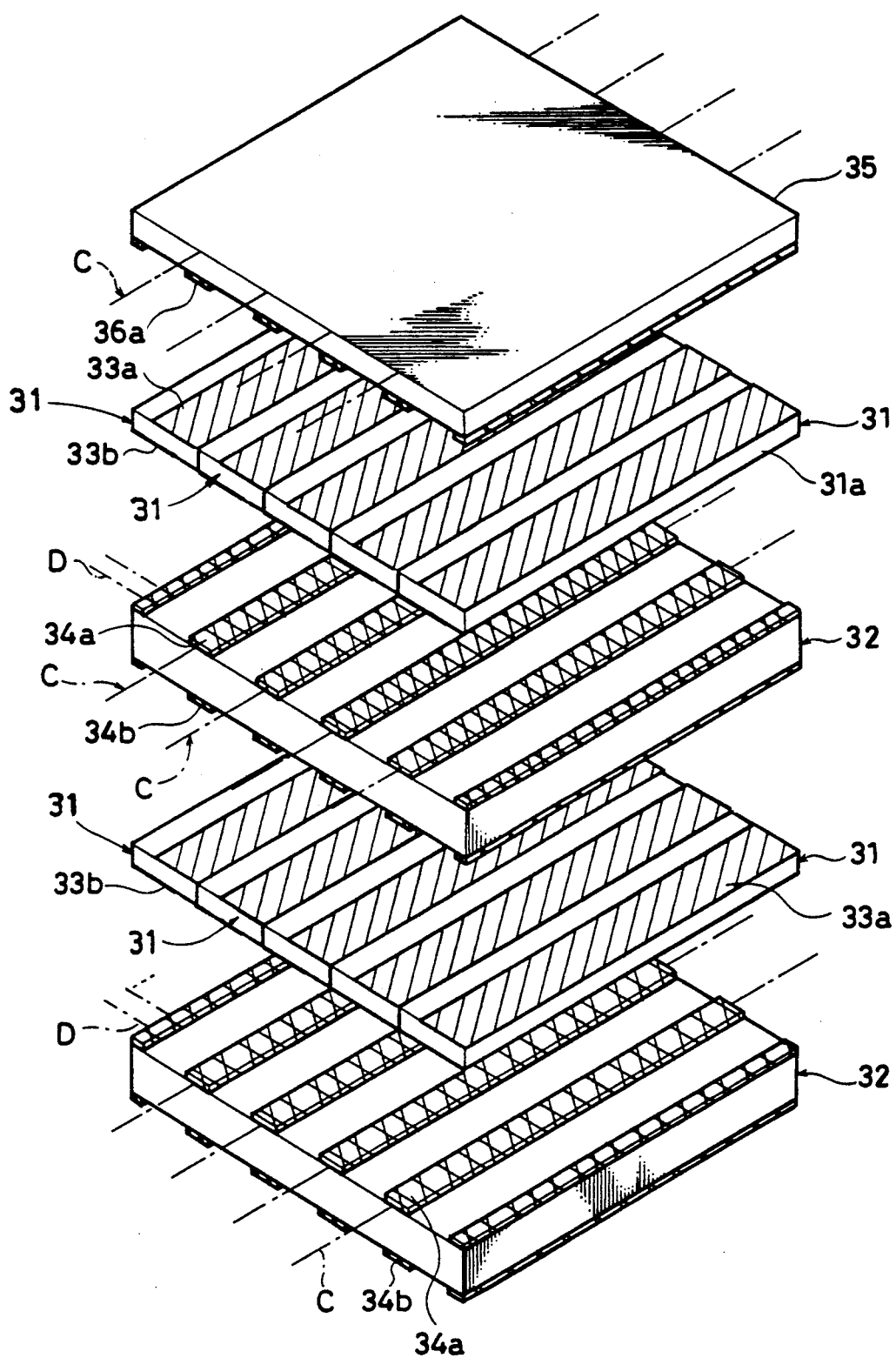
FIG. 4 is an exploded perspective view for explaining the fabricating processes of the piezoelectric resonator according to the first embodiment.
Figure 5:
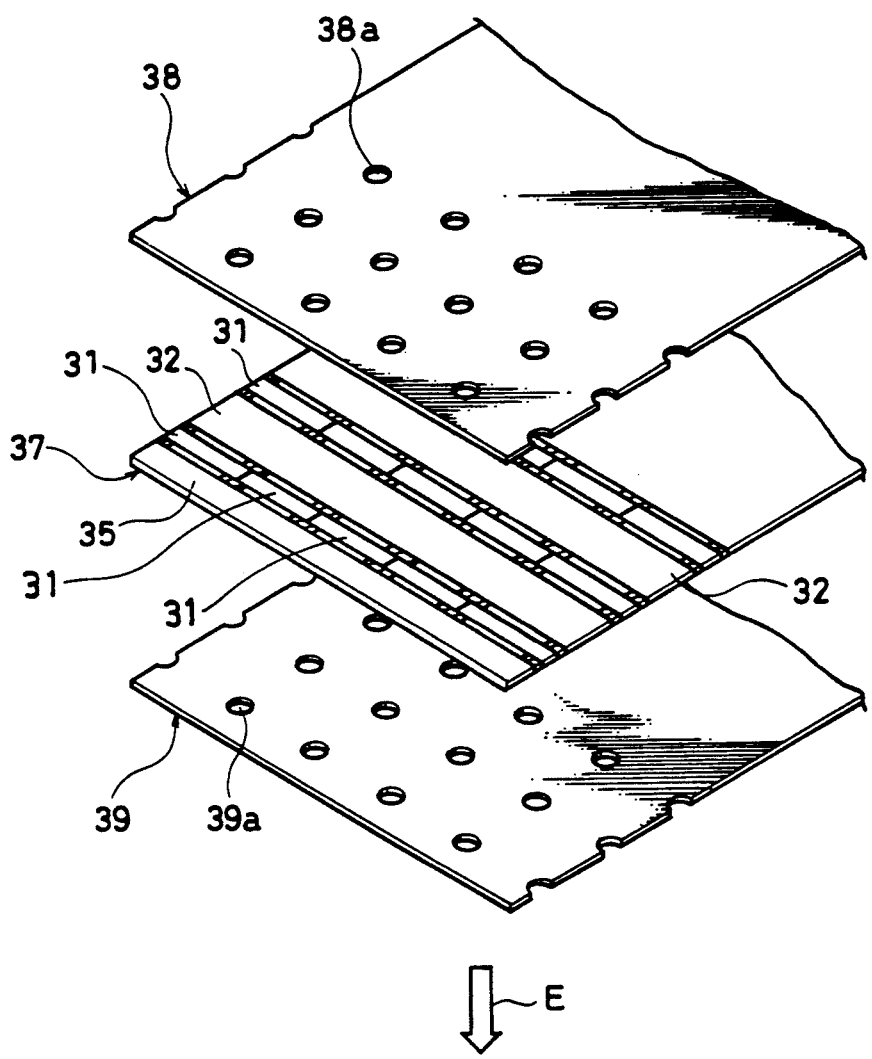
FIG. 5 is a perspective view for explaining the fabricating processes of the piezoelectric resonator according to the first embodiment.
Figure 5:
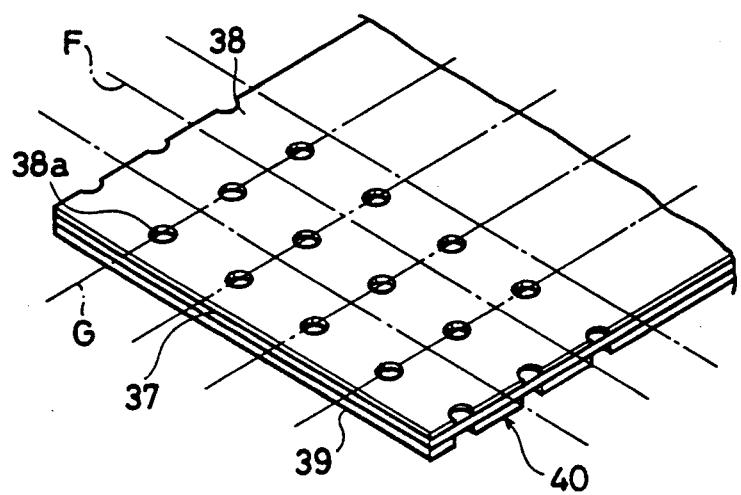

Referring now to FIGS. 4 and 5, a method of fabricating the above described piezoelectric resonator 11 will be described. As shown in FIG. 4, a plurality of mother piezoelectric resonance element members 31 and a mother spacer plate 32 are first prepared. Each of the mother piezoelectric resonance element members 31 has a structure in which electrodes 33a and 33b are formed on both major surfaces of a piezoelectric substrate 31a subjected to polarization processing. The plurality of mother piezoelectric resonance element members 31 are disposed side by side as shown in FIG. 4 and each of them is prepared so as to construct the piezoelectric resonance element 12 shown in FIG. 3. More specifically, the mother piezoelectric resonance element member 31 has such a shape that a plurality of piezoelectric resonance elements 12 as shown in FIG. 3 are connected in the transverse direction with the side, on which one of the electrodes 12b and 12c is formed, of the piezoelectric resonance element 12 shown in FIG. 3 being pointed downward. That is, the mother piezoelectric resonance element member 31 is in such a shape that a lot of piezoelectric resonance elements 12 shown in FIG. 3 are obtained by cutting in the direction at right angles to the longitudinal direction of the electrodes 33a and 33b.

On the other hand, the mother spacer plate 32 is constituted by a rectangular insulating plate, and a plurality of adhesive layers 34a and 34b are respectively provided in parallel to its upper and lower surfaces. The thickness of the mother spacer plate 32 is twice the width of the spacers 13 and 14 shown in FIG. 2. That is, the mother spacer plate 32 is so constructed that two spacers 13 and 14 are connected to each other on their side surfaces by cutting in the direction of thickness along one dot and dash lines C and one dot and dash lines D at right angles thereto.

Although in the fabricating method according to the present embodiment, the plurality of mother piezoelectric resonance element plates 31 and mother spacer plates 32 as described above are alternately laminated, a mother spacer plate 35 in the uppermost part is so constructed as to have a thickness which is one-half that of the mother spacer plate 32. In addition, a plurality of adhesive layers 36a are printed in parallel with predetermined spacing only on the lower surface of the mother spacer plate 35.

Then, a laminated body obtained by laminating the plurality of mother piezoelectric resonance element members 31, the mother spacer plates 32 and the mother spacer plate 35 is cut in the direction of thickness along one dot and dash lines D shown in FIG. 4, thereby to obtain a mother device substrate 37 shown in the center of FIG. 5. Mother cover sheets 38 and 39 are respectively affixed to both major surfaces of the mother device substrate 37. Adhesive layers, which are not particularly shown, corresponding to the adhesive layers 20 and 21 shown in FIGS. 1 and 2 are provided on the surfaces, on the side of the device substrate 37, of the mother cover sheets 38 and 39 prior to affixing. In addition, a plurality of through holes 38a and 39a are respectively formed according to a predetermined pitch on the mother cover sheets 38 and 39. The through holes 38a and 39a are provided so as to form the notches 15a, 15b, 16a and 16b shown in FIG. 2.

Then, as shown below an arrow E in FIG. 5, a laminated body 40 obtained by laminating the mother cover sheets 38 and 39 on and beneath the mother device substrate 37 is cut in the direction of thickness along one dot and dash lines F and G, thereby to make it possible to efficiently massproduce the piezoelectric resonator 11 shown in FIG. 1.

In the fabricating method described with reference to FIGS. 4 and 5, the laminated body 40 in which a plurality of piezoelectric resonators 11 are connected in the longitudinal and the transverse directions is finally obtained. Alternatively, a laminated body in which a plurality of piezoelectric resonators 11 are connected only in the longitudinal or the transverse direction may be obtained, to obtain a plurality of piezoelectric resonators 11 by cutting the laminated body only in one direction. For example, in FIG. 4, if mother piezoelectric resonance element members 31 and mother spacer plates 32 were prepared in which a plurality of piezoelectric resonance elements and a plurality of spacer plates were respectively connected only in the direction of the one dot and dash line C were prepared and laminated, and mother cover sheets 38 and 39 in such a shape that a plurality of cover sheets are connected only in the same direction as the direction of the line C were used, it would be possible to finally obtain a laminated body in which a plurality of piezoelectric resonators were connected only in one direction.

As described in the foregoing, in the piezoelectric resonator 11 shown in FIG. 1, the resonance frequency of the piezoelectric resonance element 12 is determined by the distance between the electrodes 12b and 12c, that is, the width W of the piezoelectric resonance element 12. Consequently, it is possible to provide piezoelectric resonators 11 having various resonance frequencies with the wall thickness t of the piezoelectric resonance element 12 being constant. In addition, the thickness of the piezoelectric resonance element 12 is independent of the resonance frequency. Accordingly, a piezoelectric resonance element 12 having a higher resonance frequency can be constructed without decreasing the thickness t. Consequently, a piezoelectric resonator having considerable mechanical strength can be obtained irrespective of the resonance frequency.

Experiments conducted by the inventors of the present application show that a piezoelectric resonator having substantially good properties can be obtained when the thickness t of the above described piezoelectric resonance element 12 is set to 0.15 mm and the width W thereof is set to 0.35 mm so as to construct a piezoelectric resonator 11 having a resonance frequency of, for example, 3.58 MHz. Accordingly, the resonance frequency can be set irrespective of the thickness t of the piezoelectric resonance element 12, thereby to make it possible to select cover sheets 15 and 16 having considerable strength in terms of material and construction. Consequently, it is found that further thinning can be promoted, as compared with the conventional piezoelectric resonator.

The above described adhesive layers 17, 18, 20, 21, 34a, 34b and 36a can be formed by applying adhesives having fluidity before hardening, or by affixing a frame-shaped body composed of film-shaped adhesives containing a base material.

Figure 6:
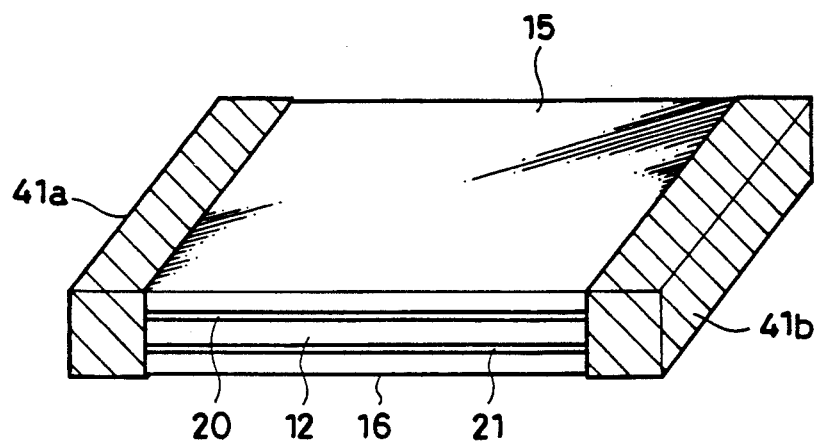
FIG. 6 is a perspective view showing a piezoelectric resonator having outer electrodes formed therein.

In the piezoelectric resonator 11 shown in FIG. 1, the above described notches 15a to 16b are formed in the cover sheets 15 and 16. It was also pointed out that the piezoelectric resonator 11 may be cut in the direction of thickness along the two-dot and dash lines A shown in FIG. 1. However a pair of outer electrodes 41a and 41b may be preferably formed so as to cover both end surfaces of the piezoelectric resonator 11 in this case, as shown in FIG. 6. Similarly, a pair of outer electrodes may be formed on both end surfaces of the piezoelectric resonator 11 provided with the notches 15a to 16b shown in FIG. 1.

Figure 7:
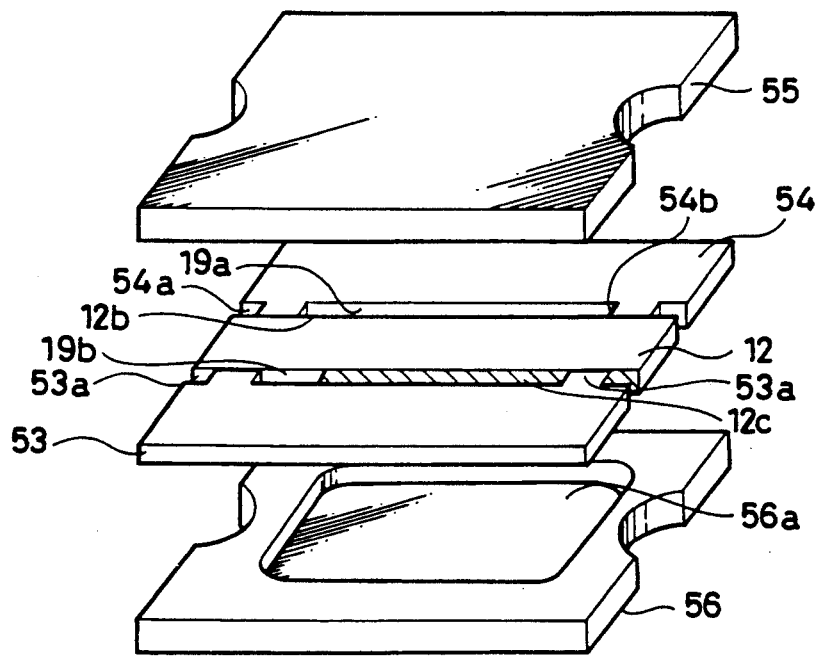
FIG 7 is an explodes perspective view showing a piezoelectric resonator according to a second embodiment of the present invention.

FIG. 7 is an exploded perspective view showing a piezoelectric resonator according to a second embodiment of the present invention. The second embodiment is characterized in that gaps for not preventing the vibration of a piezoelectric resonance element 12 are formed not by adhesives but by the shapes of spacers and cover sheets. More specifically, as shown in FIG. 7, pairs of projections 53a and 53b and 54a and 54b are respectively formed on side surfaces, on the side of the piezoelectric resonance element 12, of the spacers 53 and 54, and the projections 53a to 54b are fastened to a pair of side surfaces, which are opposed to each other, of the piezoelectric resonance element 12. That is, gaps 19a and 19b dependent on the amounts of projection of the projections 53a to 54b are respectively formed between the projections 53a and 53b and 54a and 54b.

Similarly, a cutout portion 56a is formed on the upper surface of a cover sheet 56, thereby to form a gap for not preventing the vibration of the piezoelectric resonance element 12. A similar cutout portion is also formed on the lower surface of the other cover sheet 55, thereby to form a gap for not preventing the vibration of the piezoelectric resonance element 12. The cover sheets 55 and 56 are fastened to the piezoelectric resonance element 12 and the spacers 53 and 54 in a region around the above cutout portion 56a. When the shapes for forming gaps are given to respective members such as the spacers 53 and 54 and the cover sheets 55 and 56, the thickness of adhesive layers used for joining the members can be decreased.

Meanwhile, the other structure of the piezoelectric resonator shown in FIG. 7 is the same as that of the piezoelectric resonator shown in FIG. 1 and hence, the detailed description thereof is omitted by assigning the same reference numerals to the same portions to incorporate the description of the embodiment shown in FIG. 1.

Figure 8:
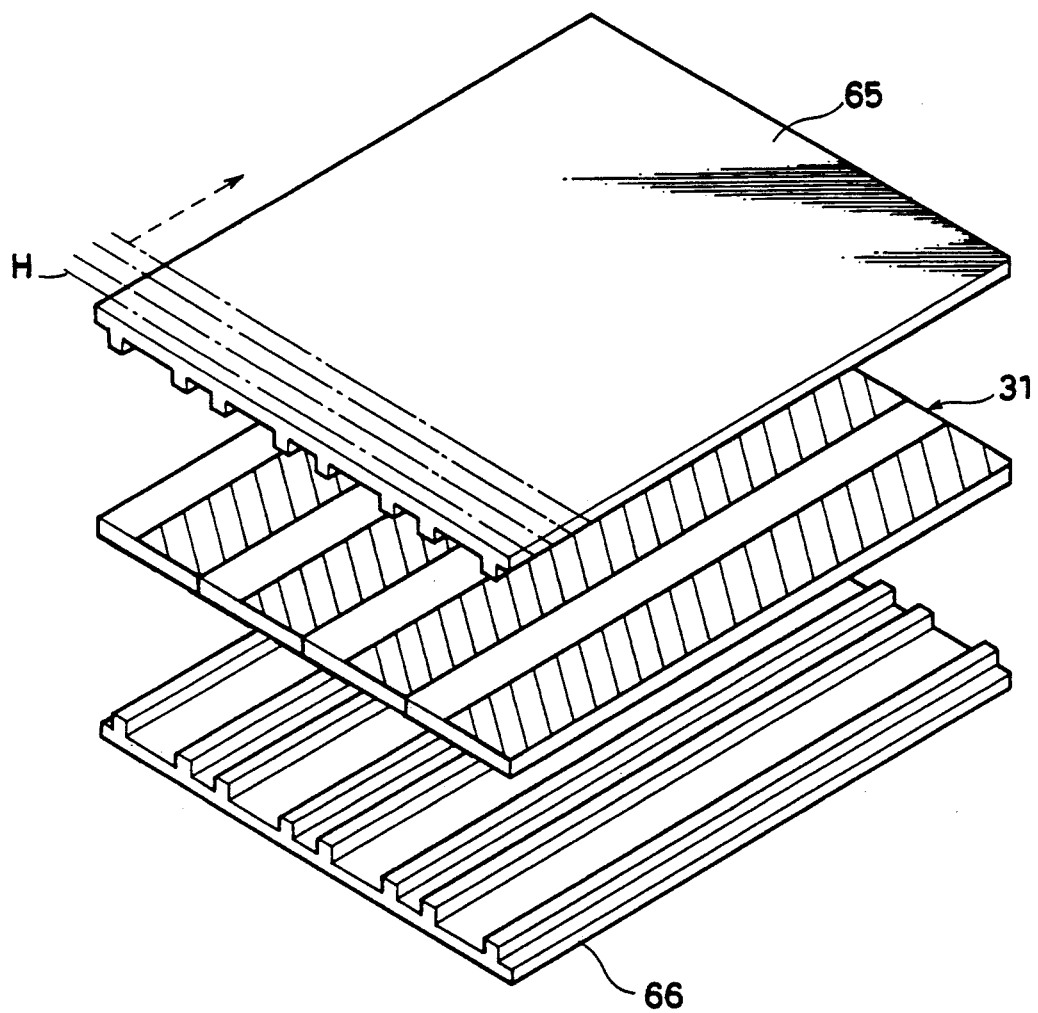
FIG. 8 is an exploded perspective view for explaining another example of a method of fabricating the piezoelectric resonator according to the present invention.
Figure 9:
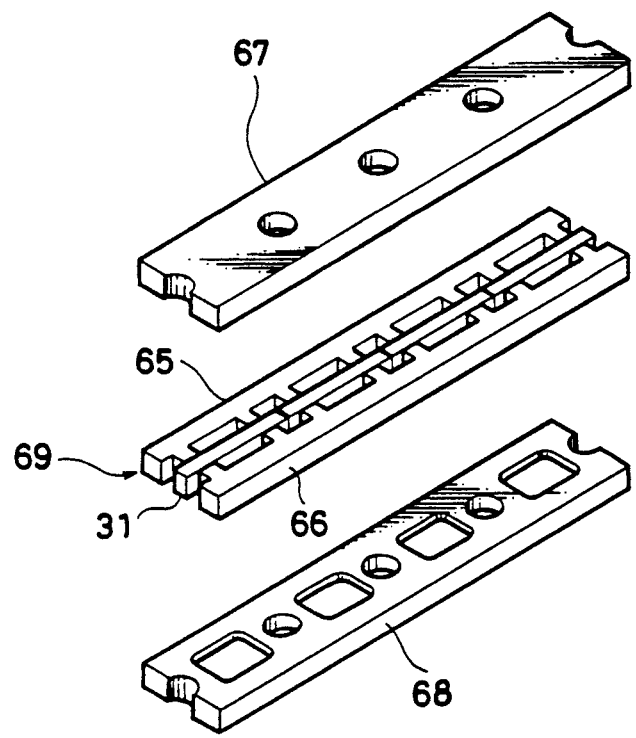
FIG. 9 is an exploded perspective view for explaining the process subsequent to the process shown in FIG. 8.

The piezoelectric resonator according to the second embodiment can be efficiently mass-produced by using mother members. For example, as shown in FIG. 8, mother spacer plates 65 and 66 are laminated on and beneath a mother piezoelectric resonance element member 31, and a laminated body obtained is cut along one dot and dash lines H shown in FIG. 8, thereby to make it possible to obtain a body in which a plurality of structures each comprising a piezoelectric resonance element 12d and spacers 53 and 54 (see FIG. 7) fastened to both sides thereof are connected along the longitudinal direction of the piezoelectric resonance element 12. Accordingly, as shown in FIG. 9, mother cover sheets 67 and 68 in such a shape that a plurality of cover sheets 55 and 56 are connected in the direction of the length of the piezoelectric resonance element 12 are respectively affixed to both major surfaces of the body 69 obtained, and a laminated body obtained is cut for each length of each piezoelectric resonance element 12, thereby to make it possible to efficiently mass-produce a plurality of piezoelectric resonators according to the second embodiment.

Figure 10A:
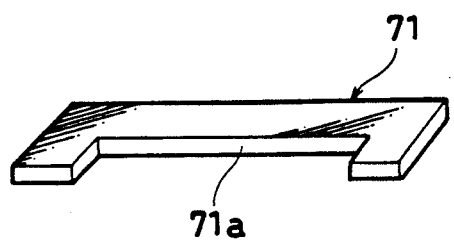
FIGS. 10A and 10B are perspective views for explaining a modified example of a spacer.

Although in the second embodiment, the spacers 53 and 54 provided with a plurality of projections 53a, 53b, 54a and 54b are used, a spacer 71 constituted by a rectangular insulating plate and provided with a notch 71a obtained by cutting away a central part of one long side of the insulating plate may be used, as shown in FIG. 10A.

Figure 10B:
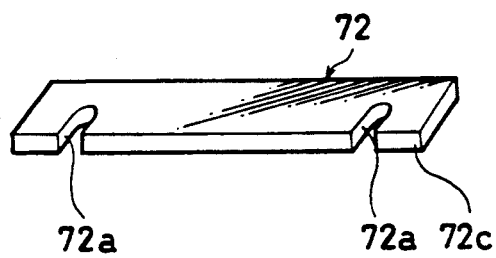
Figure 11:
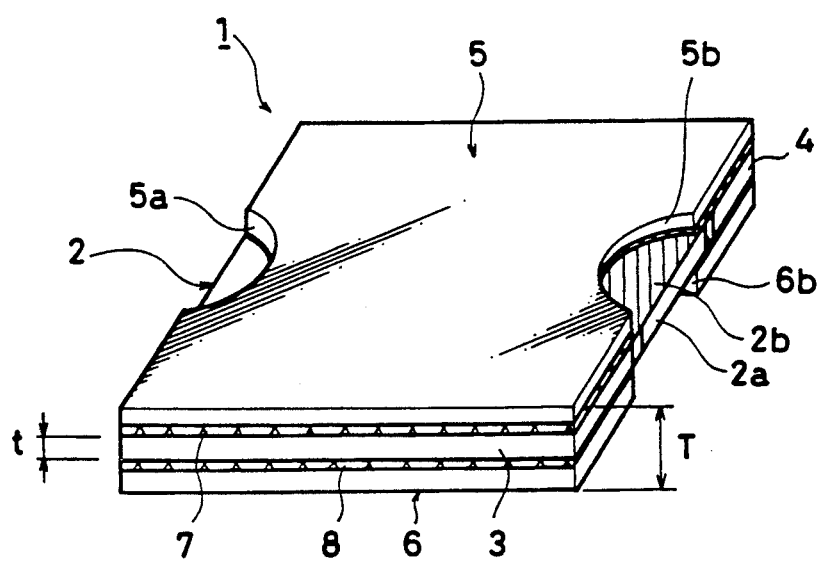
FIG. 11 is a perspective view for explaining a conventional piezoelectric resonator.
Figure 12:
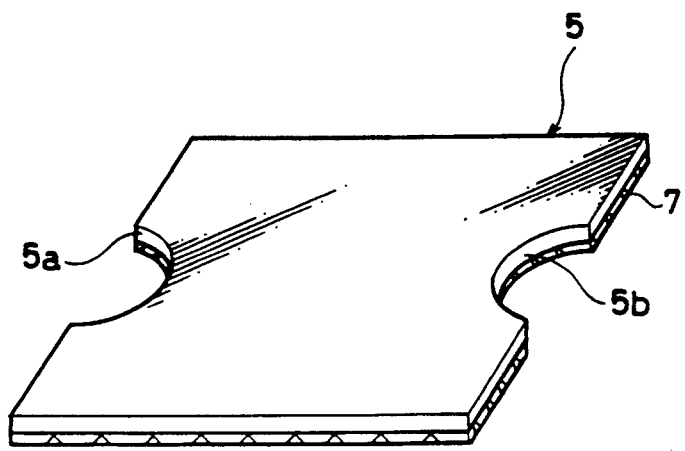
FIG. 12 is an exploded perspective view showing the conventional piezoelectric resonator.
Figure 12:
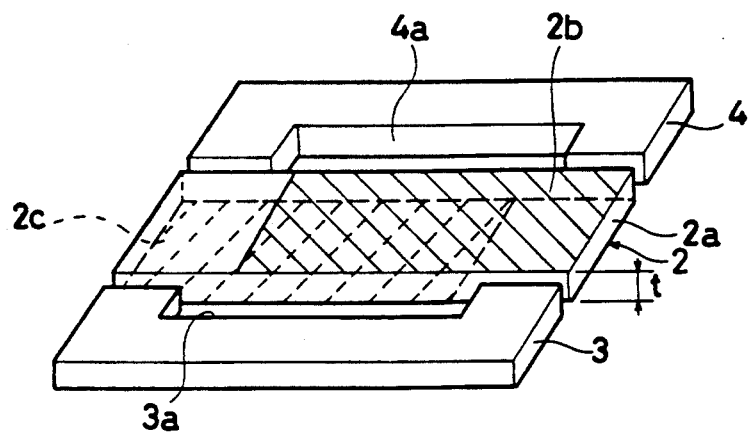
Figure 12:
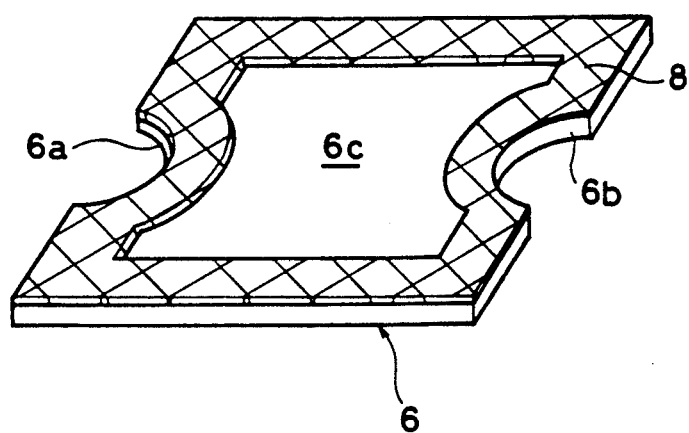

Additionally, as shown in FIG. 10B, the spacers 13 and 14 according to the first embodiment may be replaced with a spacer 72 provided with slits 72a and 72a. In this case, a side surface 72c, on the side of the slits 72a and 72a provided, of the spacer 72 is fastened to the piezoelectric resonance element 12. The spacer 72 is provided with the slits 72a and 72a, thereby to make it possible to reliably and easily apply adhesives to side surface portions outside of the slits 72a and 72a. That is, adhesives can be prevented from being applied to a side surface portion sandwiched between the slits 72a and 72a and in contact with the vibrating portion in the piezoelectric resonance element 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric resonator, comprising:
   a piezoelectric resonance element, of an energy-trapped type, utilizing a thickness shear vibration mode, the piezoelectric resonance element having a piezoelectric substrate and a pair of electrodes formed on a pair of side surfaces of the piezoelectric substrate, the side surfaces being opposed to each other and the electrodes overlapping at and being separated by a center portion of the piezoelectric substrate, the center portion thereby forming a vibrating portion in a region where said electrodes are opposed to each other when an electric field is applied to the electrodes;

spacers respectively fastened to said opposed side surfaces of the piezoelectric substrate with gaps being provided between the spacers and at least said vibrating portion so as not to prevent the vibration of said vibrating portion; and cover sheets respectively affixed to both major surfaces of said piezoelectric resonance element and said spacers so as to provide gaps on top and beneath the vibrating portion for the vibration of said vibrating portion.

2. The piezoelectric resonator according to claim 1, wherein cutout portions are respectively formed on surfaces of said cover sheets, said surfaces being fastened to said piezoelectric resonance element and said spacers, thereby forming gaps for the vibration of said vibrating portion.

3. The piezoelectric resonator according to claim 1, wherein said cover sheets are bonded to said piezoelectric resonance element and said spacers by adhesive, said adhesive not being applied between regions of the cover sheets facing said vibrating portion and the vibrating portion, thereby forming gaps for the vibration of said vibrating portion.

4. The piezoelectric resonator according to claim 1, wherein cutout portions for constituting said gaps are formed on side surfaces of said spacers, said side surfaces of said spacers being located on the side of said side surfaces of said piezoelectric resonance element.

5. The piezoelectric resonator according to claim 1, wherein said spacers are fastened to the side surfaces of said piezoelectric substrate by adhesive, said adhesive not being applied between the side surface portions of the spacers facing said vibrating portion and the vibrating portion, thereby forming gaps for the vibration of said vibrating portion.

6. The piezoelectric resonator according to claim 1, further comprising terminal electrodes respectively formed on a pair of end surfaces of said piezoelectric substrate, said end surfaces connecting the side surfaces of the piezoelectric substrate, the terminal electrode formed on each of the end surfaces being electrically connected to one of said electrodes.

7. The piezoelectric resonator according to claim 1, which further comprises a pair of outer electrodes respectively provided so as to be electrically connected to said electrodes.

8. A method of fabricating a piezoelectric resonator, comprising the steps of:

preparing a piezoelectric resonance element of an energy-trapped type and a pair of spacers composed of plate-shaped members, said piezoelectric resonance element utilizing a thickness shear vibration mode, and having a piezoelectric substrate and a pair of electrodes formed on a pair of side surfaces of the piezoelectric substrate, the side surfaces being opposed to each other and the electrodes overlapping at and being separated by a center portion of the piezoelectric substrate, the center portion forming a vibrating portion in a region where said electrodes are opposed to each other when an electric field is applied to the electrodes;

fastening said spacers to said side surfaces of said piezoelectric resonance element with gaps being provided between the spacers and said vibrating portion, respectively; and affixing a pair of cover sheets to both major surfaces of a structure comprising said spacers and said piezoelectric resonance element, respectively, so as to leave gaps for the vibration of said vibrating portion.

9. The method according to claim 8, wherein (a) said step of fastening said spacers to said piezoelectric resonance element comprises the steps of alternately laminating mother piezoelectric resonance element members, each constructed by forming mother electrodes on both major surfaces of a plate-shaped mother piezoelectric substrate, and mother spacer plates, each constructed to obtain a plurality of spacers by cutting in the direction of thickness, to obtain a laminated body, and cutting said laminated body in the direction of thickness to obtain a mother device substrate having a plurality of structures, each comprising a piezoelectric resonance element and spacers fastened to its side parts;

(b) said step of affixing cover sheets comprises the step of affixing mother cover sheets on both major surfaces of said mother device substrate; and (c) further comprising the step of cutting in the direction of thickness the mother device substrate having said mother cover sheets affixed to its surfaces, to obtain a plurality of piezoelectric resonators.

10. The method according to claim 9, wherein said spacers further comprise cutout portions for forming gaps between the spacers and the piezoelectric resonance element.

11. The method according to claim 9, wherein said mother piezoelectric resonance element member further comprises a plurality of piezoelectric resonance elements arranged in a matrix and said mother spacer plate further comprises a plurality of spacers arranged in a matrix.

12. The method according to claim 10, wherein said mother spacer plate further comprises at least one groove constructed by connecting cutout portions for forming said gaps.

13. The method according to claim 9, wherein said step of fastening said spacers to said piezoelectric resonance element includes adhesive being applied to portions excluding at least said vibrating portions of the respective piezoelectric resonance elements formed in the mother piezoelectric resonance element member, thereby forming said gaps for the vibration of said vibrating portion.

14. The method according to claim 8, wherein said cover sheets further comprise cutout portions for forming said gaps.

15. A method of fabricating a piezoelectric resonator, comprising the steps of:

preparing a piezoelectric resonance element of an energy-trapped type, utilizing a thickness shear vibration mode, having a piezoelectric substrate and a pair of electrodes respectively formed on a pair of side surfaces of the piezoelectric substrate, and a pair of spacers composed of plate-shaped members, the electrodes being opposed to each other and being separated by a center portion of the piezoelectric substrate, the center portion forming a vibrating portion when an electric field is applied to the electrodes;

fastening said spacers to said side surfaces of said piezoelectric resonance element with gaps being provided between the spacers and said vibrating portion, respectively; and affixing a pair of cover sheets to both major surfaces of a structure comprising said spacers and said piezoelectric resonance element, respectively, so as to leave gaps for the vibration of said vibrating portion;

wherein said step of fastening said spacers to said piezoelectric resonance element comprises the steps of alternately laminating mother piezoelectric resonance element members, each constructed by forming mother electrodes on both major surfaces of a plate-shaped mother piezoelectric substrate, and mother spacer plates, each constructed to obtain a plurality of spacers by cutting in the direction of thickness, to obtain a laminated body, and cutting said laminated body in the direction of thickness to obtain a mother device substrate having a plurality of structures, each comprising a piezoelectric resonance element and spacers fastened to its side surfaces said step of affixing cover sheets comprises the step of affixing mother cover sheets on both major surfaces of said mother device substrate; and comprising the step of cutting in the direction of thickness the mother device substrate having said mother cover sheets affixed to its surfaces, to obtain a plurality of piezoelectric resonators.

16. The method according to claim 15, wherein said spacers further comprise cutout portions for forming gaps between the spacers and the piezoelectric resonance element.

17. The method according to claim 15, wherein said mother piezoelectric resonance element members further comprise a plurality of piezoelectric resonance elements arranged in a matrix and said mother spacer plates further comprise a plurality of spacers arranged in a matrix.

18. The method according to claim 16, wherein said mother spacer plate further comprises at least one groove constructed by connecting cutout portions for forming said gaps.

19. The method according to claim 15, wherein said step of fastening said spacers to said piezoelectric resonance element further comprises adhesive being applied to portions excluding at least said vibrating portions of the respective piezoelectric resonance elements formed in the mother piezoelectric resonance element members, thereby forming said gaps for the vibration of said vibrating portions.

20. The method according to claim 15, wherein said cover sheets further comprise cutout portions for forming said gaps.

21. A piezoelectric resonator, comprising:
a piezoelectric resonance element, of an energy-trapped type, utilizing a thickness shear vibration mode, the piezoelectric resonance element having a piezoelectric substrate and a pair of electrodes formed on a corresponding pair of side surfaces of the piezoelectric substrate, the side surfaces being opposed to each other, each electrode extending along said corresponding side surface from a respective end of the piezoelectric substrate and terminating just past a center portion of the piezoelectric substrate, the electrodes overlapping at and being separated by the center portion of the piezoelectric substrate, the center portion thereby forming a vibrating portion in a region where said electrodes are opposed to each other when an electric field is applied to the electrodes;

spacers respectively fastened to said opposed side surfaces of the piezoelectric substrate with gaps being provided between the spacers and at least said vibrating portion so as not to prevent the vibration of said vibrating portion; and cover sheets respectively affixed to both major surfaces of said piezoelectric resonance element and said spacers so as to provide gaps on top and beneath the vibrating portion for the vibration of said vibrating portion.

22. A method of fabricating a piezoelectric resonator, comprising the steps of:

preparing a piezoelectric resonance element of an energy-trapped type and a pair of spacers composed of plate-shaped members, said piezoelectric resonance element utilizing a thickness shear vibration mode, and having a piezoelectric substrate and a pair of electrodes formed on a corresponding pair of side surfaces of the piezoelectric substrate, the side surfaces being opposed to each other, each electrode extending along said corresponding side surface from a respective end of the piezoelectric substrate and terminating just past a center portion of the piezoelectric substrate, the electrodes overlapping at and being separated by the center portion of the piezoelectric substrate, the center portion thereby forming a vibrating portion in a region where said electrodes are opposed to each other when an electric field is applied to the electrodes;

fastening said spacers to said side surfaces of said piezoelectric resonance element with gaps being provided between the spacers and said vibrating portion, respectively; and affixing a pair of cover sheets to both major surfaces of a structure comprising said spacers and said piezoelectric resonance element, respectively, so as to leave gaps for the vibration of said vibrating portion.

* * * * *